(12) United States Patent
Assefa et al.

(10) Patent No.: US 8,008,095 B2
(45) Date of Patent: Aug. 30, 2011

(54) METHODS FOR FABRICATING CONTACTS TO PILLAR STRUCTURES IN INTEGRATED CIRCUITS

(75) Inventors: Solomon Assefa, Ossining, NY (US); Gregory Costrini, Hopewell Junction, NY (US); Christopher Vincent Jahnes, Upper Saddle River, NJ (US); Michael J. Rooks, Briarcliff Manor, NY (US); Jonathan Zanhong Sun, Shrub Oak, NY (US)

(73) Assignee: International Business Machines Corporation, Armonk, NY (US)

( * ) Notice: Subject to any disclaimer, the term of this patent is extended or adjusted under 35 U.S.C. 154(b) by 808 days.

(21) Appl. No.: 11/866,455

(22) Filed: Oct. 3, 2007

(65) Prior Publication Data
US 2009/0091037 A1    Apr. 9, 2009

(51) Int. Cl.
*H01L 21/00* (2006.01)
(52) U.S. Cl. ............. 438/3; 438/618; 438/637; 365/164
(58) Field of Classification Search .................. 438/637, 438/618, 3; 365/164
See application file for complete search history.

(56) References Cited

U.S. PATENT DOCUMENTS

| | | | |
|---|---|---|---|
| 4,568,410 A | 2/1986 | Thornquist | |
| 4,717,447 A | 1/1988 | Dieleman et al. | |
| 5,286,344 A | 2/1994 | Blalock et al. | |
| 5,559,367 A | 9/1996 | Cohen et al. | |
| 5,928,967 A | 7/1999 | Radens et al. | |
| 6,767,837 B2 * | 7/2004 | Sun et al. | 438/714 |
| 6,784,091 B1 * | 8/2004 | Nuetzel et al. | 438/618 |
| 6,933,155 B2 * | 8/2005 | Albert et al. | 438/3 |
| 7,205,164 B1 * | 4/2007 | Geha et al. | 438/3 |
| 2004/0100855 A1 * | 5/2004 | Saito et al. | 365/232 |
| 2005/0287738 A1 * | 12/2005 | Cho et al. | 438/253 |

OTHER PUBLICATIONS

A. Grill, "Plasma-deposited diamondlike carbon and related materials," IBM J. Res. Develop., Jan./Mar. 1999, pp. 147-161, vol. 43, No. 1/2, IBM.
A. Grill et al, "Diamondlike carbon films by rf plasma-assisted chemical vapor deposition from acetylene," IBM J. Res. Develop., Nov. 1990, pp. 849-857, vol. 34, No. 6, IBM.
R. Desikan et al., "On-chip MRAM as a High-Bandwidth Low-Latency Replacement for DRAM Physical Memories," Tech Report TR-O2-47, Sep. 2002, Dept. of Computer Sciences, University of Texas.

* cited by examiner

*Primary Examiner* — David Vu
*Assistant Examiner* — Brandon Fox
(74) *Attorney, Agent, or Firm* — Vazken Alexanian; Ryan, Mason & Lewis, LLP

(57) ABSTRACT

A pillar structure that is contacted by a vertical contact is formed in an integrated circuit. A hard mask is formed and utilized to pattern a least a portion of the pillar structure. The hard mask comprises carbon. Subsequently, the hard mask is removed. A conductive material is then deposited in a region previously occupied by the hard mask to form the vertical contact. The hard mask may, for example, comprise diamond-like carbon. The pillar structure may have a width or diameter less than about 100 nanometers.

16 Claims, 6 Drawing Sheets

Prior Art

Prior Art

METHODS FOR FABRICATING CONTACTS TO PILLAR STRUCTURES IN INTEGRATED CIRCUITS

FIELD OF THE INVENTION

This invention relates generally to integrated circuits, and, more particularly, to techniques for forming and contacting pillar structures in integrated circuits.

BACKGROUND OF THE INVENTION

Magnetic memory devices, such as magnetic random access memory (MRAM) devices, use magnetic memory cells to store information. Information is stored in a magnetic memory cell as the orientation of the magnetization of a free layer as compared to the orientation of the magnetization of a fixed or pinned layer. The magnetization of the free layer may be oriented parallel or anti-parallel to the fixed layer, representing either a logic "0" or a logic "1." One type of memory cell, a magnetic tunnel junction (MTJ), consists of a pillar structure comprising a free layer and a fixed layer separated by a thin dielectric barrier (a tunnel barrier), which typically comprises $Al_2O_3$, MgO, or MgO sandwiched between thin layers of metal. The resistance of the memory cell depends on the direction of magnetization of the free layer relative to the direction of magnetization of the fixed layer. Thus, the state of the cell can be sensed by measuring its resistance.

Methods of reproducibly and reliably forming and contacting pillar structures in integrated circuits are presently undergoing intensive research. In the process integration of MRAM, for example, one of the challenging processing steps is the formation of a vertical contact between an MTJ pillar structure and an overlying conductive line. Unfortunately, this problem becomes progressively more difficult as MRAM is scaled to the smaller MTJ dimensions required for the 45 nm and 32 nm ground rule nodes.

Currently, there are two main MRAM integration approaches for forming vertical contacts between MTJ pillar structures and conductive lines. The first approach, illustrated in FIGS. 1A-1E, utilizes a via-level mask that is aligned and overlaid to an MTJ pillar structure. To achieve this, an MTJ pillar structure 100 is first patterned using a thin conductive hard mask 110 (e.g., TaN, TiN, or Al), as shown in FIG. 1A, and then encapsulated by an inter-layer dielectric (ILD) 120, as shown in FIG. 1B. Then, via lithography is performed and a via 130 is etched into the ILD, landing on the MTJ pillar structure, as shown in FIG. 1C. This is followed by the patterning of a metallization level, achieved by etching a trench 140 in the shape of a line that overlies the via, as shown in FIG. 1D. Finally, the structure is metallized in order to form a vertical contact 150 between a conductive line 160 and the MTJ pillar structure, as shown in FIG. 1E. Even though this approach works well for relatively large MTJ pillar structures (e.g., those with widths or diameters greater than about 100 nm), it has limitations as MTJ sizes become smaller. Overlay errors make alignment of the via to the MTJ pillar structure extremely difficult as the size of the MTJ shrinks. Hence, the via-based approach is not useful for MRAM scaling to 45 nm and 32 nm nodes.

The second approach utilizes a tall conductive hard mask (e.g., TaN, TiN, or Al) as a vertical contact, as illustrated in FIGS. 2A-2E. To form this thick hard mask on top of an MTJ pillar structure, the MTJ pattern is first transferred into a thick conductive layer that is deposited on top of magnetic layers. This patterned layer is then used as a hard mask to etch the magnetic structure. The resultant MTJ pillar structure 200 with tall hard mask 210 is shown in FIG. 2A. It is then encapsulated with dielectric layers 220 and 230, as shown in FIG. 2B, and planarized, as shown in FIG. 2C. Next, a trench 240 in the shape of a line is etched into the dielectric layers in such a manner that the hard mask protrudes into the trench, a shown in FIG. 2D. Finally the trench is filled with metal, which allows the tall hard mask to serve as a vertical contact between a conductive line 250 and the MTJ pillar structure, as shown in FIG. 2E. Because the size of the hard mask scales with the size of the MTJ pillar structure, the approach provides a path for forming vertical contacts to small MTJ structures (e.g., those below 100 mm in width or diameter). However, patterning the MTJ using a tall conductive hard mask is problematic due to the formation of sidewall redeposition, shown as feature 260 in the figures, that shorts the junctions, and foot structures due to shadowing during etching. Furthermore, the planarization step usually introduces non-uniformity, which is transferred into the etch process used to form the trench for the conductive line. As a result, the trench may be too shallow, resulting in an open circuit, or the trench may be too deep, etching to the base of the MTJ pillar structure at position 270 and causing a short circuit, as shown in FIGS. 2D and 2E. Due to these problems, the tall hard mask approach does not provide a straight-forward path for the formation of contacts for MRAM scaling.

For the foregoing reasons, there is a need for reliable and reproducible methods of forming contacts to sub-100 nm pillar structures in integrated circuits.

SUMMARY OF THE INVENTION

Embodiments of the present invention address the above-identified need by providing methods for forming and contacting pillar structures in integrated circuits such that the pillar structures are electrically connected to overlying conductive lines by self-aligned vertical contacts.

In accordance with an aspect of the invention, a pillar structure that is contacted by a vertical contact is formed in an integrated circuit. A hard mask is formed and utilized to pattern a least a portion of the pillar structure. The hard mask comprises carbon. Subsequently, the hard mask is removed. A conductive material is then deposited in a region previously occupied by the hard mask to form the vertical contact.

In accordance with one of the above-identified embodiments of the invention, a feature comprising diamond-like carbon (DLC) is utilized as a hard mask to anisotropically etch an MTJ pillar structure. Dielectric materials are then deposited on the DLC hard mask such that they surround the sidewalls and the top of the hard mask. Later, the top of the DLC hard mask is exposed in part by forming a trench in the dielectric material immediately above the hard mask. The trench is in the shape of a conductive line (e.g., a wordline or bitline). After removing the DLC hard mask, the trench for the conductive line and the region previously occupied by the hard mask are filled with a conductive material. In this way a self-aligned vertical contact is formed above the MTJ pillar structure that acts to provide a contact between the pillar structure and the overlying conductive line.

Advantageously, the above-described method embodiment provides a robust and easily scalable process by which to implement various kinds of pillar structures with widths or diameters less than about 100 nm in integrated circuits.

These and other features and advantages of the present invention will become apparent from the following detailed description which is to be read in conjunction with the accompanying drawings.

DETAILED DESCRIPTION OF THE INVENTION

Figure 1A:
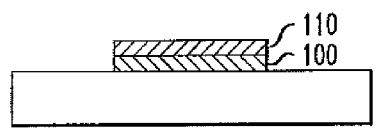
FIGS. 1A-1E show sectional views of a first method of contacting an MTJ pillar structure.
Figure 1B:
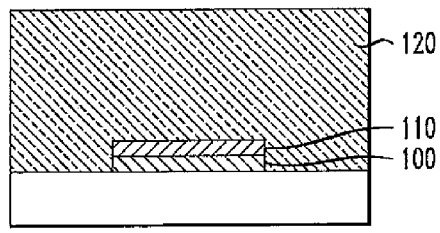
Figure 1C:
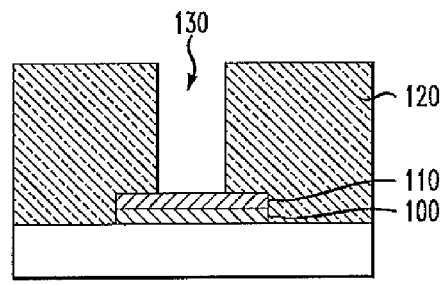
Figure 1D:
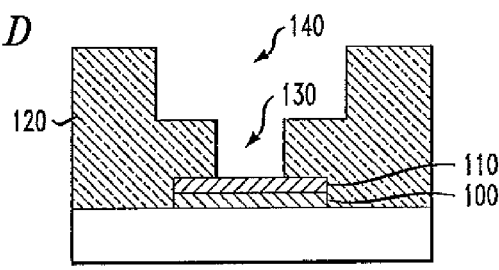
Figure 1E:
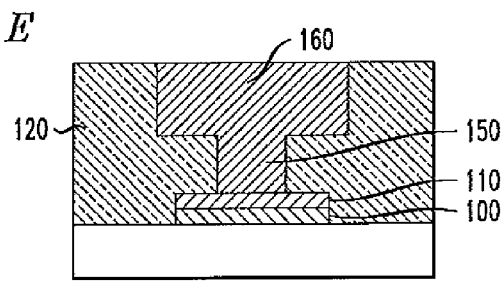
Figure 2A:
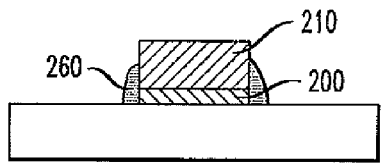
FIGS. 2A-2E show sectional views of a second method of contacting an MTJ pillar structure.
Figure 2B:
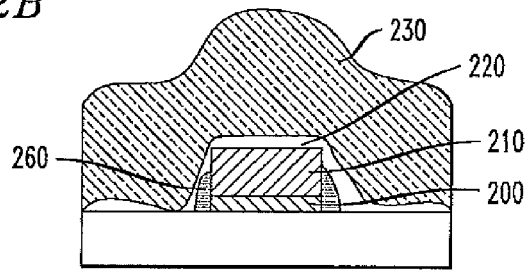
Figure 2C:
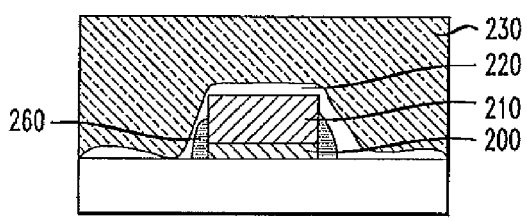
Figure 2D:
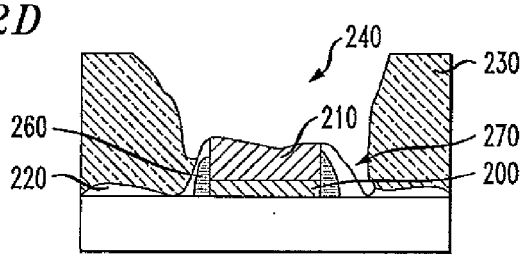
Figure 2E:
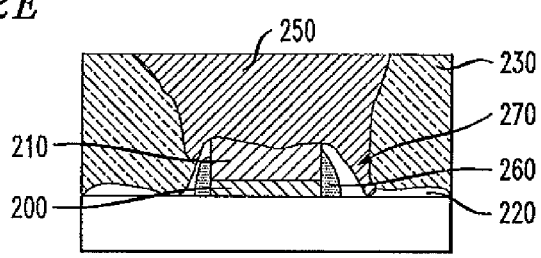

The present invention will be described with reference to illustrative embodiments. For this reason, numerous modifications can be made to these embodiments and the results will still come within the scope of the invention. No limitations with respect to the specific embodiments described herein are intended or should be inferred.

Particularly with respect to processing steps, it is emphasized that the descriptions provided herein are not intended to encompass all of the processing steps which may be required to successfully form a functional device. Rather, certain processing steps which are conventionally used in forming integrated circuit devices, such as, for example, wet cleaning and annealing steps, are purposefully not described herein for economy of description. However one skilled in the art will readily recognize those processing steps omitted from this generalized description. Moreover, details of conventional semiconductor processing steps described herein will only be described generally since the details of these conventional processes will be known to one skilled in the art and since there are commercially available semiconductor processing tools for implementing these processing steps. Details of the process steps used to fabricate semiconductor devices may be found in a number of publications, for example, S. Wolf and R. N. Tauber, *Silicon Processing for the VLSI Era, Volume I*, Lattice Press, 1986; and S. Wolf, *Silicon Processing for the VLSI Era, Volume 4: Deep Submicron Process Technology*, Lattice Press, 2002, both of which are incorporated herein by reference.

It should also be understood that the various layers and/or regions shown in the accompanying figures are not drawn to scale, and that one or more semiconductor layers and/or regions of a type commonly used in such integrated circuits may not be explicitly shown in a given figure for ease of explanation. This does not imply that the semiconductor layers and/or regions not explicitly shown are omitted from the actual integrated circuit.

The term "pillar structure" as used herein is intended to encompass any single or multi-component feature that protrudes above the surface of the layer on which the pillar structure is disposed and which is contacted via one of its upper surfaces. While the illustrative embodiments described herein are directed at methods of forming and contacting MTJ pillar structures for use in MRAM applications, methods in accordance with aspects of the invention may be useful with many other types of pillar structures found in integrated circuits. Such alternative pillar structures may include, but are not limited to, spin-valve structures for use in MRAMs, as well phase-change memory cells for use in phase-change memories (PCMs). When considered top down (i.e., when considered in a plane perpendicular to the sectional views shown herein), a pillar structure may be of any shape (e.g., round, elliptical, square, rectangular, hexagonal, octagonal, etc.).

Figure 3:
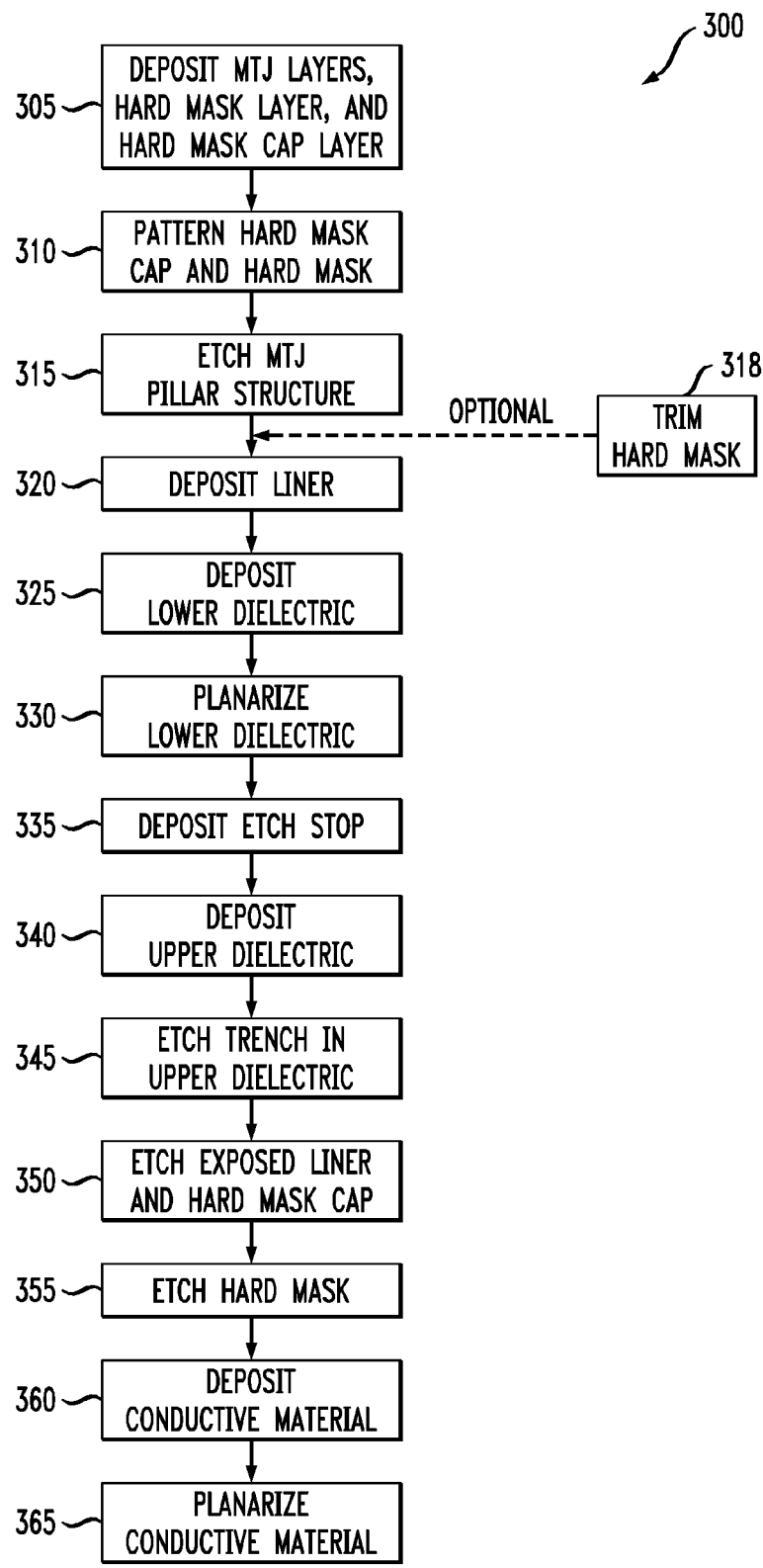
FIG. 3 shows a flow diagram of a method in accordance with an illustrative embodiment of the invention for forming an MTJ memory cell.

FIG. 3 shows a flow diagram of a method 300 in accordance with an illustrative embodiment of the invention for forming and contacting an MTJ pillar structure such that the MTJ pillar structure is electrically connected to an overlying conductive line by a self-aligned vertical contact. FIGS. 4A-4K, in turn, show sectional views of an MTJ memory cell 400 formed using the FIG. 3 method in various stages of its formation.

Figure 4A:
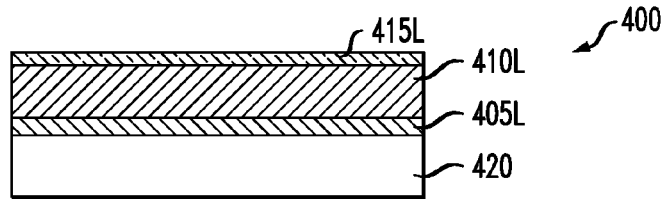
FIGS. 4A-4K show sectional views of an MTJ memory cell formed using the FIG. 3 method in various stages of formation.

Step 305 in FIG. 3 comprises sequentially depositing the layers of materials that will form an MTJ pillar structure 405L, the layer of material that will form a hard mask 410L, and a layer of material that will form a hard mask cap 415L onto a substrate 420, as shown in FIG. 4A.

While shown in FIG. 4A as a single layer 405L for simplicity, an actual MTJ pillar structure will typically comprise two magnetic layers and a thin dielectric layer in between the magnetic layers that acts as a tunneling barrier. Each magnetic layer, in turn, will comprise a number of sublayers that serve various functions such as acting as barrier layers, seed layers, antiferromagnetic layers, coupling layers, and ferromagnetic layers. Desikan et al., in "On-chip MRAM as a High-Bandwidth Low Latency Replacement for DRAM Physical Memories," Tech Report TR-02-47, Department of Computer Sciences, University of Texas, September 2002, for example, describes an MTJ pillar structure with a lower magnetic layer comprising five sublayers formed of Co/Fe, Ni/Fe, Mg/Fe, Pt, and W, respectively. The upper magnetic layer in the same device comprises three sublayers formed of Ni/Fe, Co/Fe, and Pt, respectively. The dielectric barrier is $Al_2O_3$. The components of the MTJ pillar structure are preferably deposited by sputtering.

The hard mask comprises carbon. While graphite, hydrocarbon polymer, and diamond hard masks would fall within the scope of the invention, a hard mask comprising DLC is preferred. Because of their attractive properties, DLC films have been technologically developed for a variety of applications and, therefore, will be familiar to one skilled in the art. Such applications include tool and die coatings, optical coatings, and protective coatings for magnetic recording media. DLC is an amorphous, in most cases, hydrogenated, metastable material. Unlike diamond and graphite, DLC films lack any long-range order and typically contain a mixture of $sp^3$-, $sp^2$-, and sometime $sp^1$-coordinated carbon (i.e., hybridized carbon) in a disordered network. The ratio between the carbon atoms in the different coordinations depends on deposition conditions and, in hydrogenated DLC films, has been found to be a strong function of the hydrogen content of the films. While missing a long-range order, DLC may have a medium-range order (i.e., they may be characterized by a microcrystalline phase within an amorphous phase). The properties of DLC therefore cover a wide range of values between those of diamond, graphite, and hydrocarbon polymers. The properties of DLC may be modified by adding various additives to DLC such as nitrogen, silicon, fluorine, and metal atoms.

Several methods for depositing DLC are known in the art such as direct current (dc) or radio frequency (rf) plasma-enhanced chemical vapor deposition (PECVD) (also called plasma-assisted chemical vapor deposition (PACVD)), sputtering, ion-beam deposition, laser ablation, and others. The PECVD of DLC under different process conditions is described in detail in, for example, A. Grill et al., "Diamond-like Carbon Films by RF Plasma-assisted Chemical Vapor Deposition from Acetylene," IBM Journal of Research and Development, Volume 34, Number 6, November 1990, pp. 849-857; and A. Grill, "Plasma-deposited Diamondlike Carbon and Related Materials," IBM Journal of Research and Development, Volume 43, Number 1/2, January/March 1999, pp. 147-161, which are both incorporated by reference herein.

The hard mask cap preferably comprises silicon nitride (i.e., $Si_xN_y$), but other suitable materials may also be utilized. Silicon nitride is commonly deposited in semiconductor processing by, for example, low pressure chemical vapor deposition (LPCVD) using $SiCl_4$ and $NH_3$ as reactants, or by PECVD using $SiH_4$ and $NH_3$ (or $N_2$) as reactants.

Figure 4B:
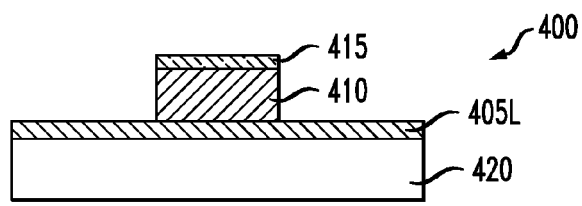

Step 310 comprises patterning the layer of hard mask cap material 415L and the layer of hard mask material 410L to form a hard mask cap 415 and a hard mask 410, as shown in FIG. 4B. Such a step is preferably achieved by depositing a photoresist on the film stack and using conventional photolithography to define an opening in the photoresist in the location and shape of the desired MTJ pillar structure. With the developed photoresist in place, an anisotropic etch process such as reactive ion etching (RIE) is then used to pattern the hard mask cap and hard mask, after which, the photoresist is stripped. RIE of silicon nitride is commonly accomplished using fluorine-containing reactants such as $CF_4$ or $SF_4$ in the presence of $O_2$. RIE of DLC is conventionally performed using a plasma containing atomic oxygen or hydrogen, which react with the DLC to produce volatile species which can be pumped out of the system.

Figure 4C:
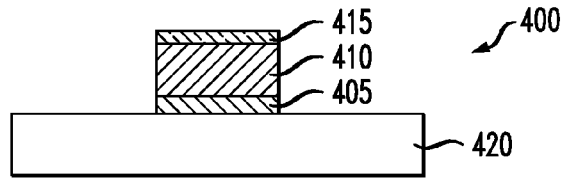

Step 315 comprises anisotropically etching the layers of MTJ materials 405L using the hard mask cap 415 and hard mask 410 as masking layers during the etch. An MTJ pillar structure 405 is thereby formed, as shown in FIG. 4C. This etch is preferably by RIE or ion milling. Ion milling (also known as ion-beam etching) differs from RIE in that ion milling typically is an entirely mechanical process that depends on high energy ions (e.g., ionized argon) impinging on a substrate to sputter or erode surface materials. Ion milling is typically a highly anisotropic process.

Figure 4D:
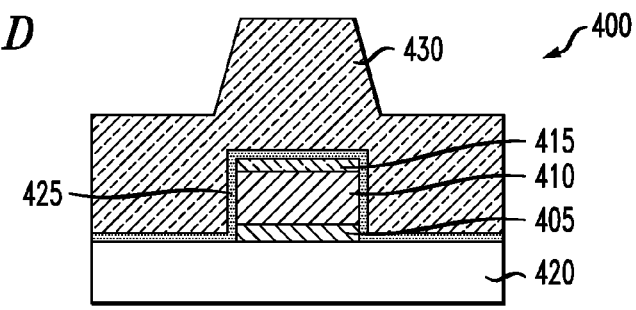

Step 320 comprises depositing a liner 425 on the film stack, while step 325 comprises forming a lower dielectric 430 on the film stack. The resultant film stack is shown in FIG. 4D. The liner preferably comprises the same material as the hard mask cap 415 (e.g., silicon nitride) and may be deposited using the same methods as the hard mask cap. The lower dielectric preferably comprises a dielectric material different from the material forming the hard mask cap. For example, if the hard mask cap comprises silicon nitride, the lower dielectric would preferably comprise silicon oxide ($SiO_x$). Silicon oxide is routinely deposited on semiconductor wafers by LPCVD of $Si(OC_2H_5)_4$ (tetraethoxysilane—TEOS).

Figure 4E:
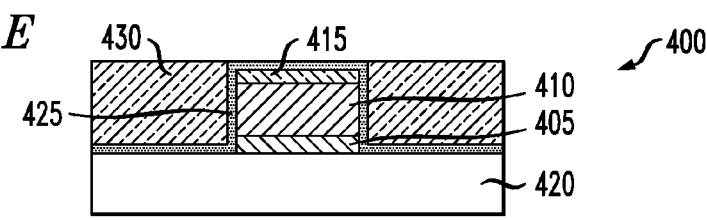

Step 330 comprises planarizing the lower dielectric 430 down to the liner 425, resulting in the film stack shown in FIG. 4E. Such planarization may be accomplished by conventional chemical mechanical polishing (CMP).

Figure 4F:
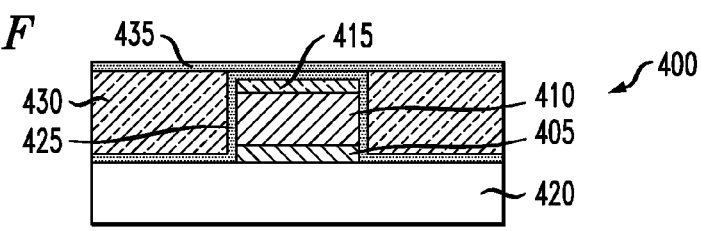

Step 335, comprises depositing an etch stop 435 on the planarized film stack, as shown in FIG. 4F. The etch stop preferably comprises the same material as the hard mask cap 415 (e.g., silicon nitride) and may be formed using similar deposition processes as those used to deposit the hard mask cap.

Figure 4G:
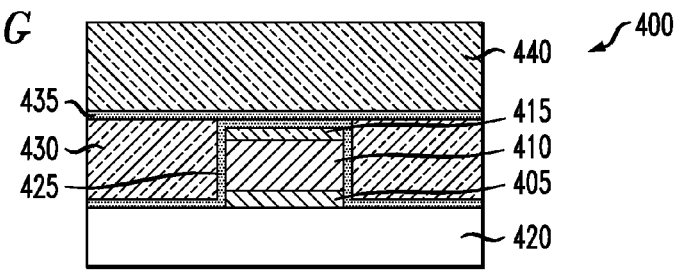

Step 340 comprises depositing an upper dielectric 440, resulting in the film stack shown in FIG. 4G. The upper dielectric preferably comprises the same material as the lower dielectric 430 (e.g., silicon oxide) and may be formed using similar deposition processes as those used to deposit the lower dielectric.

Figure 4H:
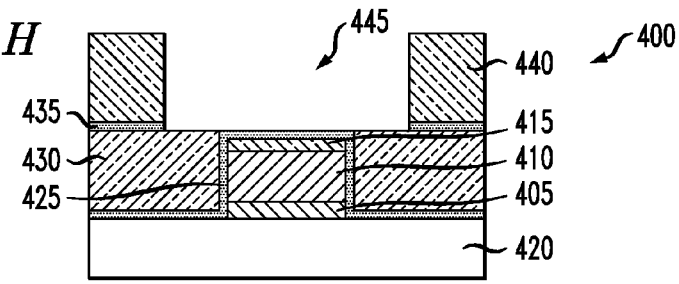

Step 345 comprises anisotropically etching a trench 445 into the upper dielectric 435. The trench preferably lands on the etch stop 435, as shown in FIG. 4H. The trench may have the shape of a line so as to form a conductive line (e.g., wordline or bitline) for the underlying MTJ pillar structure 405. The trench may be formed by conventional photolithography and RIE processes. The etch is preferably designed to selectively etch the upper dielectric 440 without etching, or only very slowly etching, the etch stop. In this way, the trench etch can proceed all the way to the etch stop without the possibility of progressing beyond this layer and damaging the underlying features. If the upper dielectric comprises silicon oxide and the etch stop comprises silicon nitride, such a selective etch process can be accomplished by conventional RIE using a fluorocarbon plasma. U.S. Pat. No. 5,268,344, entitled "Process for Selectively Etching a Layer of Silicon Dioxide on an Underlying Stop Layer of Silicon Nitride" (incorporated by reference herein), for example, describes the use a combination of $CHF_3$, $CF_4$, $CH_2F_2$, and Ar to selectively etch silicon oxide with a selectivity of oxide-to-nitride of about 30:1. In addition, U.S. Pat. No. 5,928,967, entitled "Selective Oxide-to-Nitride Etch Process using $C_4F_8$/CO/Ar" (also incorporated by reference herein), achieves high oxide-to-nitride selectivities using a combination of $C_4F_8$, CO, and Ar.

Figure 4I:
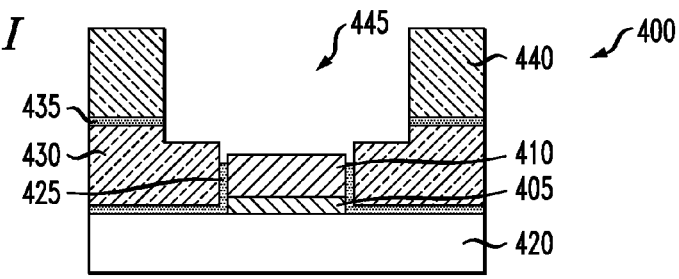

Step 350 comprises anisotropically etching the exposed etch stop 435, liner 425, and hard mask cap 415 selectively to the exposed surfaces of the lower dielectric 430, the upper dielectric 440, and the hard mask 410. In this way, the upper surface of the hard mask is exposed, as shown in FIG. 4I. If the etch stop, liner, and hard mask cap comprise silicon nitride, the hard mask comprises DLC, and the upper dielectric and lower dielectric comprise silicon oxide, such a selective etch can also be accomplished with a RIE process that uses a fluorocarbon plasma. For example, U.S. Pat. No. 4,717,447, entitled "Method of Manufacturing a Semiconductor Device by Means of Plasma Etching" (incorporated by reference herein) describes the use of a combination of $CF_3Br$, F, and He to achieve a nitride-to-oxide selectivity of about 19:1. U.S. Pat. No. 4,568,410, entitled "Selective Plasma Etching of Silicon Nitride in the Presence of Silicon Dioxide" (incorporated by reference herein), describes the use of a mixture of $NF_3$ and $O_2$ to achieve nitride-to-oxide selectivities in excess of about 8:1.

Figure 4J:
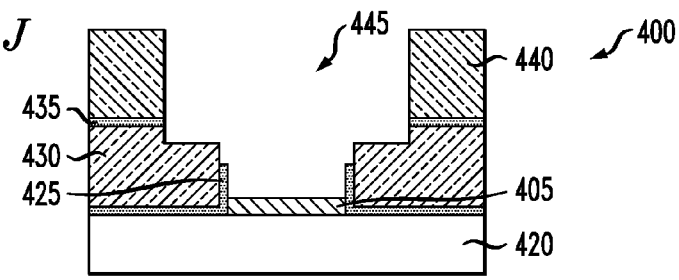

Step 355 comprises anisotropically etching the exposed hard mask 410 so that it is entirely removed from the film stack and the MTJ pillar structure 405 is exposed, as shown in FIG. 4J. This etch can again be performed by RIE using a plasma including atomic oxygen or hydrogen.

Figure 4K:
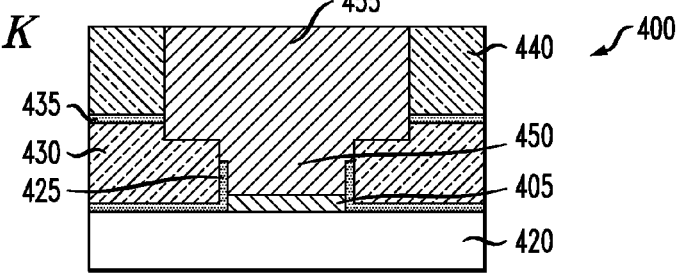

Step 360 comprises simultaneously depositing a conformal conductive material into the region previously occupied by the hard mask 410, the hard mask cap 415, and some of the liner 425, as well as into the trench 445. The conductive material may comprise metallic materials such as, but not limited to, Al, Cu, W, Ti, Ta, or alloys thereof, and may be deposited by conventional chemical vapor deposition, sputtering, or plating techniques. A thin metallic liner (e.g., Ti and/or TiN) may optionally be introduced before depositing a thicker layer of conductive material. Subsequently, in step 365, any excess conductive material is planarized by, for example, CMP such that any excess material is removed from the top of the upper dielectric 440, as shown in FIG. 4K. During planarization, care is preferably taken to avoid any residual conductive material on the upper dielectric that may cause shorting. In this way, a vertical contact 450 that is self-aligned to the MTJ pillar structure 405 is formed. The vertical contact electrically connects the MTJ pillar structure to an overlying conductive line 455.

The use of DLC for the hard mask 410 provides several advantages over the use of other types of materials such as metallic materials. If the MTJ pillar structure 405 is formed by ion milling in step 315, for example, the possibility of sidewall redeposition during the milling is reduced because DLC has a very low sputter yield due to its relative hardness. DLC is also resistant to most wet chemical etches which may be required to clean the sidewalls of the MTJ pillar structure after it is etched or ion milled. Moreover, DLC can be easily removed from the top of MTJ pillar structure in step 355 by using a plasma of atomic oxygen or hydrogen. Such an etch process is relatively mild and benign when compared to, for example, the halogen-based etch chemistries required to etch alternative hard mask materials (e.g., TaN, TiN, or Al). Such a mild etch process is less likely to negatively impact (e.g., poison) those materials constituting the MTJ pillar structure.

DLC also has the advantage of being a very effective polish stop material, again, because of its relative hardness. In the above-described method 300, for example, this property allows the option of planarizing the lower dielectric 430 to the hard mask 410 in step 330 instead of planarizing it to the liner 425. Such an option may be advantageous if difficulty is encountered when trying to stop a planarization process on the relatively thin liner. Planarizing to the hard mask in this manner does not substantially alter the remainder of the steps in the illustrative method.

DLC further has the advantage of being easily trimmed, that is, having its width or diameter reduced while its height is left unchanged. An optional trimming step 318 is shown in FIG. 3 and is preferably performed between steps 315 and 320. It may be accomplished by using an etch process that etches the hard mask 410 without substantially etching the hard mask cap 415 or MTJ pillar structure 405. For DLC, such an etch process may be accomplished by exposing the DLC to a plasma comprising atomic oxygen or hydrogen without placing a substantial bias on the substrate being etched. Operating without a substantial bias allows the etch to be considerably isotropic.

Figure 5A:
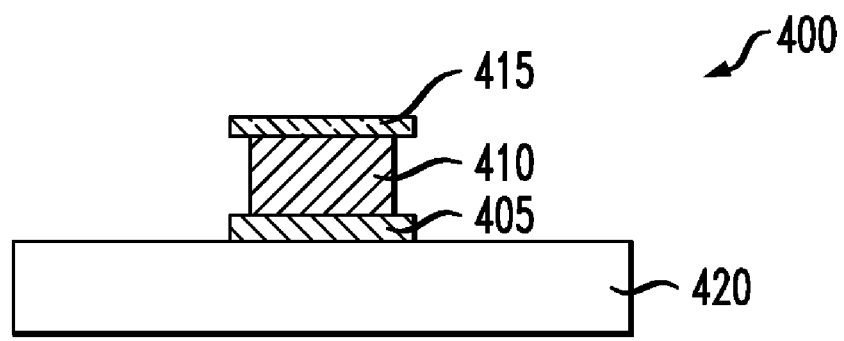
FIGS. 5A-5B show sectional views of an MTJ memory cell formed using the FIG. 3 method in various stages of formation with trimming of the hard mask.
Figure 5B:
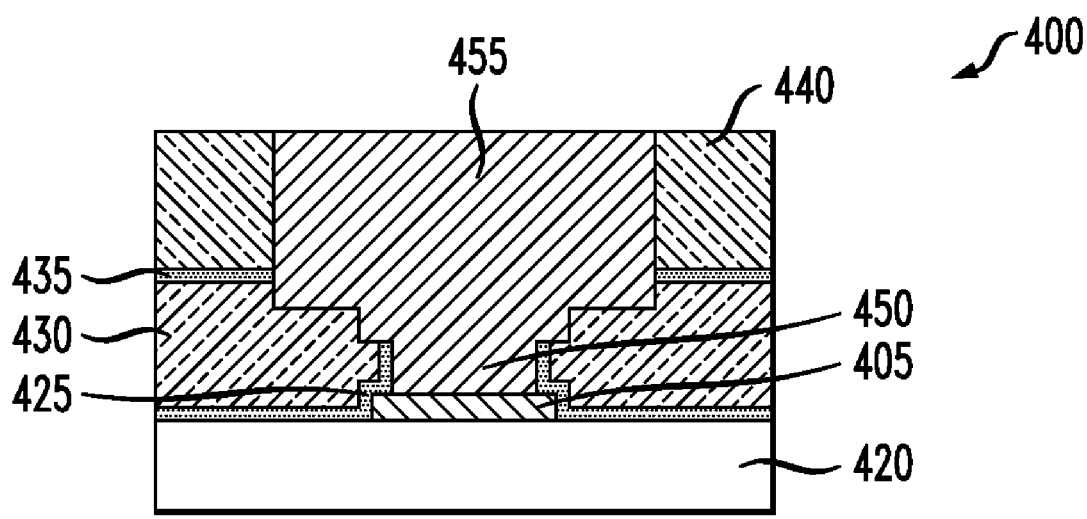

FIG. 5A shows the film stack after the optional trimming step 318. FIG. 5B, in turn, shows the film stack after step 365 is completed. As can be seen from the figures, the optional trimming step has the effect of narrowing the resultant vertical contact 450. Narrowing the vertical contact may be beneficial in some applications to avoid the possibility of the vertical contact shorting to other nearby active features.

DLC also provides advantages with respect to device characterization. As described above, conventional MTJ memory cell formation techniques typically use a metallic hard mask feature. This metallic feature may interfere with Kerr magnetometry measurements, a very useful method for studying magnetic anisotropy in ferromagnetic films in MRAM devices. Briefly, Kerr magnetometry measures the rotation of the polarization of light reflected from the surface of a magnetic material under study as a function of applied magnetic field. The Kerr signal is proportional to the magnetic moment of the sample under test. A hard mask comprising DLC will not interfere with these optical measurements because DLC is transparent to the light used in Kerr analysis, thereby allowing Kerr measurements to be obtained with the DLC hard mask in place. Alternatively, Kerr measurements may be accomplished after hard mask is removed and before the film stack is filled with conductive material.

Methods in accordance with aspects of the invention may be utilized to form an integrated circuit chip. The chip design is created in a graphical computer programming language, and is stored in a computer storage medium (such as a disk, tape, physical hard drive, or virtual hard drive such as in a storage access network). If the designer does not fabricate chips or photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are formed on a wafer. The photolithographic masks are utilized to define areas of the wafer (and/or the layers thereon) to be etched or otherwise processed.

The resulting integrated circuit chips may be distributed by the fabricator in raw wafer form (i.e., as a single wafer that has multiple unpackaged chips), as a bare die, or in packaged form. In the latter case, the chip is mounted in a single chip package (e.g., plastic carrier with leads that are affixed to a motherboard or other higher level carrier) or in a multichip package (e.g., ceramic carrier that has either or both surface interconnections or buried interconnections). In any case, the chip is then integrated with other chips, discrete circuit elements, and/or other signal processing devices as part of either an intermediate product (e.g., motherboard) or an end product. The end product may be any product that includes integrated circuit chips, ranging from toys and other low-end applications to advanced computer products having a display, a keyboard or other input device, and a central processor.

Although illustrative embodiments of the present invention have been described herein with reference to the accompanying figures, it is to be understood that the invention is not limited to those precise embodiments, and that various other changes and modifications may be made to these embodiments by one skilled in the art without departing from the scope of the appended claims.

What is claimed is:

1. A method of forming a pillar structure that is contacted by a vertical contact in an integrated circuit, the method comprising the steps of:
   sequentially depositing pillar structure material layers, a hard mask layer and a hard mask cap layer on a substrate;
   patterning the hard mask cap and hard mask layers to form a hard mask cap and a hard mask on the pillar structure material layers, the hard mask comprising carbon;
   utilizing the hard mask cap and the hard mask to pattern at least a portion of the pillar structure material layers to form a pillar structure;
   depositing a liner on the hard mask cap, hard mask and pillar structure;
   forming a lower dielectric layer in contact with a side portion of the liner;
   depositing a stop layer on top of the lower dielectric layer and a portion of the liner disposed above the hard mask cap, hard mask and pillar structure;
   forming an upper dielectric layer on top of the stop layer;
   forming a trench in the upper dielectric layer down to the stop layer;
   removing the stop layer and the liner and the hard mask cap selectively to exposed surfaces of the lower and upper dielectric layers and the hard mask to expose an upper surface of the hard mask;
   removing the hard mask; and
   depositing a conductive material into the trench and a region previously occupied by the hard mask to form the vertical contact and a conductive line.

2. The method of claim 1, wherein the hard mask comprises diamond-like carbon.

3. The method of claim 1, wherein the hard mask comprises diamond, graphite, or hydrocarbon polymer.

4. The method of claim 1, wherein the pillar structure comprises a magnetic tunnel junction.

5. The method of claim 1, wherein the pillar structure comprises a spin-valve structure.

6. The method of claim 1, wherein the pillar structure comprises a phase-change memory structure.

7. The method of claim 1, wherein the step of utilizing the hard mask to pattern at least a portion of the pillar structure comprises reactive ion etching.

8. The method of claim 1, wherein the step of utilizing the hard mask to pattern at least a portion of the pillar structure comprises ion milling.

9. The method of claim 1, wherein the step of removing the hard mask comprises etching with a plasma comprising atomic oxygen or atomic hydrogen, or a combination thereof.

10. The method of claim 1, further comprising the step of trimming the hard mask for narrowing the hard mask without reducing the height of the hard mask and without narrowing a width of the hard mask cap and the pillar structure.

11. The method of claim 1, wherein the pillar structure has a width or diameter less than about 100 nanometers.

12. The method of claim 1, wherein the conductive material is planarized to the top surface of the upper dielectric layer.

13. A pillar structure that is contacted by a vertical contact in an integrated circuit, the pillar structure and vertical contact formed at least in part by the steps of:
sequentially depositing pillar structure material layers, a hard mask layer and a hard mask cap layer on a substrate;
patterning the hard mask cap and hard mask layers to form a hard mask cap and a hard mask on the pillar structure material layers, the hard mask comprising carbon;
utilizing the hard mask cap and the hard mask to pattern at least a portion of the pillar structure material layers to form a pillar structure;
depositing a liner on the hard mask cap, hard mask and pillar structure;
forming a lower dielectric layer in contact with a side portion of the liner;
depositing a stop layer on top of the lower dielectric layer and a portion of the liner disposed above the hard mask cap, hard mask and pillar structure;
forming an upper dielectric layer on top of the stop layer;
forming a trench in the upper dielectric layer down to the stop layer;
removing the stop layer and the liner and the hard mask ca selectively to exposed surfaces of the lower and upper dielectric layers and the hard mask to expose an upper surface of the hard mask;
removing the hard mask; and
depositing a conductive material into the trench and a region previously occupied by the hard mask to form the vertical contact and a conductive line.

14. The pillar structure that is contacted by a vertical contact in an integrated circuit of claim 13, wherein the pillar structure and vertical contact are formed at least in part by a further step of trimming the hard mask for narrowing the hard mask without reducing the height of the hard mask and without narrowing a width of the hard mask cap and the pillar structure.

15. An integrated circuit comprising a pillar structure that is contacted by a vertical contact, the pillar structure and the vertical contact formed at least in part by the steps of:
sequentially depositing pillar structure material layers, a hard mask layer and a hard mask cap layer on a substrate;
patterning the hard mask cap and hard mask layers to form a hard mask cap and a hard mask on the pillar structure material layers, the hard mask comprising carbon;
utilizing the hard mask cap and the hard mask to pattern at least a portion of the pillar structure material layers to form a pillar structure;
depositing a liner on the hard mask cap, hard mask and pillar structure;
forming a lower dielectric layer in contact with a side portion of the liner;
depositing a stop layer on top of the lower dielectric layer and a portion of the liner disposed above the hard mask cap, hard mask and pillar structure;
forming an upper dielectric layer on top of the stop layer;
forming a trench in the upper dielectric layer down to the stop layer;
removing the stop layer and the liner and the hard mask cap selectively to exposed surfaces of the lower and upper dielectric layers and the hard mask to expose an upper surface of the hard mask;
removing the hard mask; and
depositing a conductive material into the trench and a region previously occupied by the hard mask to form the vertical contact and a conductive line.

16. The integrated circuit comprising a pillar structure that is contacted by a vertical contact of claim 15, wherein the pillar structure and the vertical contact are formed at least in part by a further step of trimming the hard mask for narrowing the hard mask without reducing the height of the hard mask and without narrowing a width of the hard mask cap and the pillar structure.

* * * * *